(12) United States Patent  
Li et al.

(10) Patent No.: US 8,880,253 B2  
(45) Date of Patent: Nov. 4, 2014

(54) NONLINEAR ADAPTIVE OBSERVATION APPROACH TO BATTERY STATE OF CHARGE ESTIMATION

(75) Inventors: Yonghua Li, Ann Arbor, MI (US); Richard Dyche Anderson, Plymouth, MI (US); Jing Song, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 258 days.

(21) Appl. No.: 13/171,090

(22) Filed: Jun. 28, 2011

(65) Prior Publication Data

US 2013/0006454 A1 Jan. 3, 2013

(51) Int. Cl.
| | |
|---|---|
| *B60L 11/00* | (2006.01) |
| *H02J 7/00* | (2006.01) |
| *B60L 11/18* | (2006.01) |
| *B60W 20/00* | (2006.01) |
| *B60W 10/26* | (2006.01) |
| *G01R 31/36* | (2006.01) |

(52) U.S. Cl.
CPC .............. *B60W 10/26* (2013.01); *G01R 31/362* (2013.01); *B60L 2260/52* (2013.01); *B60L 2260/44* (2013.01); *G01R 31/3651* (2013.01); *Y02T 10/7044* (2013.01); *B60L 2250/16* (2013.01); *Y02T 10/7005* (2013.01); *Y02T 10/705* (2013.01); *B60L 11/1861* (2013.01); *B60W 20/106* (2013.01); *B60W 2510/244* (2013.01)
USPC ................ 701/22; 320/132; 701/1; 701/29.1; 701/34.4; 701/36

(58) Field of Classification Search
CPC .......... B60W 20/00; B60W 2510/244; B60W 10/26; B60L 11/1809; B60L 11/1851; B60L 11/1864; B60L 11/1866; B60L 11/1872; B60L 11/1887; B60L 2260/44; G01R 31/3606

USPC ............. 429/61; 701/22; 180/65.265, 62.265; 320/104, 137
See application file for complete search history.

(56) References Cited

U.S. PATENT DOCUMENTS

| 6,362,598 B2 | 3/2002 | Laig-Horstebrock et al. |
| 6,441,586 B1 | 8/2002 | Tate, Jr. et al. |

(Continued)

FOREIGN PATENT DOCUMENTS

| EP | 1873542 B1 | 1/2008 |
| WO | 2006057468 A1 | 6/2006 |
| WO | 2009025528 A1 | 2/2009 |

OTHER PUBLICATIONS

State-of-Charge and State-of-Health prediction of Lead-acid Batteries for Hybrid Electric Vehicles using non-linear observers Authors: B.S. Bhangu. P. Bentley, D.A. Stone and C.M. Bingham Publication: IEEE Transactions on Vehicular Technology, vol. 54, No. 3, May 2005.

(Continued)

*Primary Examiner* — Khoi Tran  
*Assistant Examiner* — Robert Nguyen  
(74) *Attorney, Agent, or Firm* — David B. Kelley; Brooks Kushman P.C.

(57) ABSTRACT

A method of controlling an electric vehicle including an internal combustion engine, a battery having a state of charge (SOC) and an open circuit voltage (OCV), includes establishing a system for estimating battery SOC. The system includes (i) a parameter estimation subsystem including a recursive parameter estimator for identifying battery parameters and (ii) an OCV estimation subsystem including a nonlinear adaptive observer for estimating battery OCV. Estimated battery OCV is related to estimated battery SOC by a mapping. An output is generated based on the estimated battery SOC.

16 Claims, 4 Drawing Sheets

(56) References Cited

U.S. PATENT DOCUMENTS

| | | | |
|---|---|---|---|
| 6,534,954 B1* | 3/2003 | Plett | 320/132 |
| 6,639,385 B2 | 10/2003 | Verbrugge et al. | |
| 7,109,685 B2 | 9/2006 | Tate, Jr. et al. | |
| 7,352,156 B2 | 4/2008 | Ashizawa et al. | |
| 7,521,895 B2 | 4/2009 | Plett | |
| 2004/0162683 A1 | 8/2004 | Verbrugge et al. | |
| 2008/0054850 A1* | 3/2008 | Tae et al. | 320/136 |
| 2011/0309838 A1 | 12/2011 | Lin et al. | |
| 2012/0072145 A1* | 3/2012 | Zhang et al. | 702/63 |
| 2012/0105069 A1* | 5/2012 | Wang et al. | 324/427 |

OTHER PUBLICATIONS

Predicting state of charge of lead-acid batteries for hybrid electric vehicles by extended Kalman filter Authors: Vasebi, A; Bathaee, SMT; Partovibakhsh, M-Publication: Energy Conversion and Management 49 (2008) 75-82; Publication date: Jul. 17,2007.

Nonlinear state of charge estimator for hybrid electric vehicle battery Authors: Kim, Il-Song Publication: IEEE Transactions on Power Electronics, v 23, n 4, p. 2027-2034 Publication date: Jul. 2008.

J. Chiasson and B. Vairamohan, Estimating the State of Charge of a Battery, IEEE Transactions on Control Systems Technology, vol. 13, No. 3, pp. 465-470, 2005.

D. D. Domenico, G. Fiengo, and A. Stefanopoulou, Lithium-ion Battery State of Charge Estimation With a Kalman Filter Based on a Electrochemical Model, in Proceedings of the 17th IEEE International Conference on Control Applications Part of 2008 IEEE Multi-conference on Systems and Control, IEEE, San Antonio, Texas, USA: IEEE Press, 6 pgs., Sep. 2008.

I. Buchmann, Charging Lithium-Ion Batteries, http://www.batteryuniversity.com/partone-12.htm., pp. 1-58, Nov. 2010.

G. Welch and G. Bishop, An Introduction to the Kalman Filter, Department of Computer Science, University of North Carolina at Chapel Hill, Chapel Hill, NC 27599-3175, Tech. Rep., pp. 1-16, Jul. 24, 2006.

S. Diop, J. W. Grizzle, F. Chaplais, On Numerical Differentiation Algorithms for Nonlinear Estimation, In the Proceedings of the IEEE Conference on Decision and Control, Sydney, Australia, 6 pgs., 2000.

Abraham Savitzky, Marcel J. E. Golay, Smoothing and Differentiation of Data by Simplified Least Squares Procedures, Analytical Chemistry, vol. 36, No. 8, pp. 1627-1639, Jul. 1964.

P. Holoborodko, "Numerical Methods," www.holoborodko.com, 6 pgs., Aug. 24, 2009.

G. Plett, Efficient Battery Pack State Estimation Using Bar-Delta Filtering, EVS24 Stavanger, Norway, pp. 1-8, May 13-16, 2009.

* cited by examiner

NONLINEAR ADAPTIVE OBSERVATION APPROACH TO BATTERY STATE OF CHARGE ESTIMATION

TECHNICAL FIELD

The invention relates to a nonlinear adaptive observer approach to battery state of charge (SOC) estimation.

BACKGROUND

Hybrid vehicles come in different forms, may use different energy storage devices, and serve different customer needs. Existing hybrid vehicles include hybrid electric vehicles (HEV), which use batteries as the energy storage system. The plug-in hybrid electric vehicle (PHEV) is an extension of existing hybrid electric vehicle (HEV) technology. A PHEV utilizes a larger capacity battery pack than a standard hybrid vehicle, and adds the capability to recharge the battery from a standard electrical outlet to decrease fuel consumption and to further improve the fuel economy in an electric driving mode or in a blended driving mode. There are also battery electric vehicle (BEV) applications where an electric machine completely replaces the internal combustion engine.

Battery state of charge (SOC) is defined as percentage of available charge as compared with the maximum charge capacity. For a battery with capacity Q, charge/discharge efficiency $\eta$, and current I:

$$\frac{dSOC}{dt} = -\frac{\eta I}{Q} \qquad (1)$$

By convention, current is positive when flowing out (discharge). For example, in charge operation, current is negative (flow in), and the SOC value would rise based on equation (1).

An existing method of calculating SOC is to use amp-hour integration. Due to the nature of the method, the SOC as calculated may drift from real SOC.

Background information may be found in WO06057468A1, EP1873542B1, U.S. Pat. No. 6,534,954, and US20080054850A1.

SUMMARY

In one embodiment, a method of controlling an electric vehicle is provided. The vehicle includes an internal combustion engine, a battery having a state of charge (SOC) and an open circuit voltage (OCV). The method comprises establishing a system for estimating battery SOC, including (i) a parameter estimation subsystem including a recursive parameter estimator for identifying battery parameters and (ii) an OCV estimation subsystem including a nonlinear adaptive observer for estimating battery OCV. Estimated battery OCV is related to estimated battery SOC by a mapping. The method further comprises generating an output based on the estimated battery SOC.

It is appreciated that embodiments of the invention may include one or more additional features, individually or in various combinations. As well, embodiments of the invention may be used in electric vehicles including, for example, hybrid electric vehicles (HEVs), plug-in hybrid electric vehicles (PHEVs), battery electric vehicles (BEVs), or other electric vehicle applications.

In one feature, the adaptive observer estimates battery OCV based in part on the identified battery parameters. In a further feature, the adaptive observer estimates battery OCV based in part on a previous estimate of battery OCV. In a further feature, the system is operable in a closed loop mode wherein the recursive parameter estimator estimates battery parameters based in part on a previous estimate of battery OCV. In a further feature, in the closed loop mode the system estimates battery SOC based on a current estimate of battery OCV and the mapping.

In addition to the closed loop mode, in another feature, the system is operable in an open loop mode wherein the system estimates battery SOC based on a current-time integration. In a further feature, in the open loop mode the recursive parameter estimator estimates battery parameters based in part on the estimated battery SOC and the mapping. In a further feature, the system operates in the open loop mode at startup, and switches to the closed loop mode based on a predetermined condition.

The predetermined condition may be based on, for example, a timer and/or an input current assessment indicative of the richness of the input current.

In another aspect of the invention, the recursive parameter estimator may have a first gain in the open loop mode and a second gain that is less than the first gain in the closed loop mode. Further, the adaptive observer may have a first gain in the open loop mode and a second gain that is less than the first gain in the closed loop mode.

In another embodiment, an electric vehicle includes an internal combustion engine, a battery having a state of charge (SOC) and an open circuit voltage (OCV). The vehicle further comprises a controller for estimating battery SOC. The controller includes (i) a parameter estimation subsystem including a recursive parameter estimator for identifying battery parameters and (ii) an OCV estimation subsystem including a nonlinear adaptive observer for estimating battery OCV. Estimated battery OCV is related to estimated battery SOC by a mapping. The controller is configured to generate an output based on the estimated battery SOC.

In another embodiment, an electric vehicle comprises a controller configured to estimate battery state of charge (SOC) and generate an output based on the estimated battery SOC. The estimated battery SOC is in accordance with (i) a recursive parameter estimator for identifying battery parameters and (ii) a nonlinear adaptive observer for estimating battery open circuit voltage (OCV). Estimated battery OCV is related to estimated battery SOC by a mapping.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

FIGS. 1-6 illustrate an example embodiment of the invention. All features described below may vary in other embodiments of the invention, depending on the application.

In the example embodiment of the invention, the state of charge estimation problem is considered for batteries satisfying the following properties: charge and discharge efficiencies are known; open circuit voltage (OCV) is a monotonically increasing, one-to-one, first order differentiable function of SOC; SOC-OCV curve may depend on temperature and battery life; SOC-OCV relationship can be represented by a family of curves (temperature dependent, battery aging).

For the example embodiment, it is assumed that complete knowledge of SOC-OCV relationship, charge/discharge efficiencies, and battery capacity are known or can be adequately learned in real-time.

Figure 1:
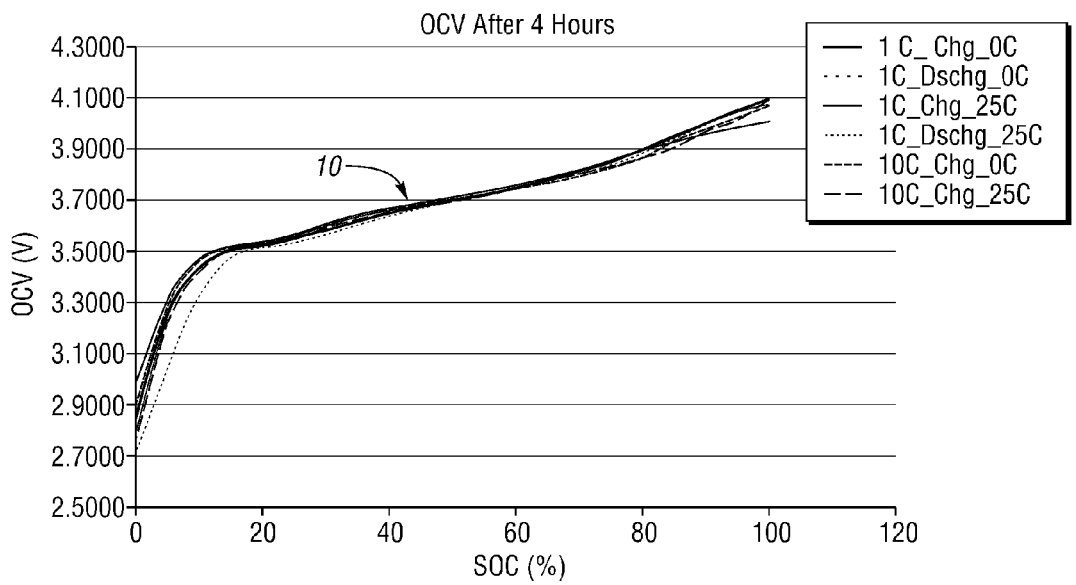
FIG. 1 illustrates the SOC-OCV relationship curves in an embodiment of the invention.

FIG. 1 illustrates the SOC-OCV relationship curves representative of the family of batteries in the embodiment. The relationship curves are generally indicated at 10.

The state-of-charge and open-circuit voltage can be related by a monotonically increasing, one-to-one, first-order differentiable function:

$$V_{OC} = f(SOC) \tag{3}$$

Figure 2:
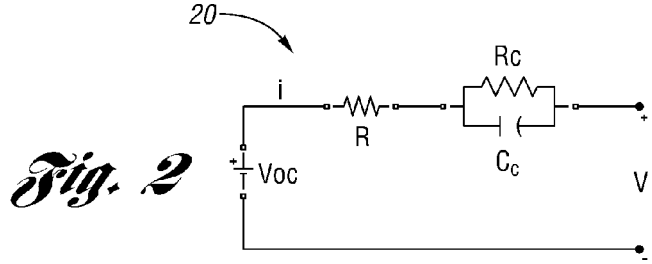
FIG. 2 illustrates a battery equivalent circuit model in an embodiment of the invention.
Figure 5:
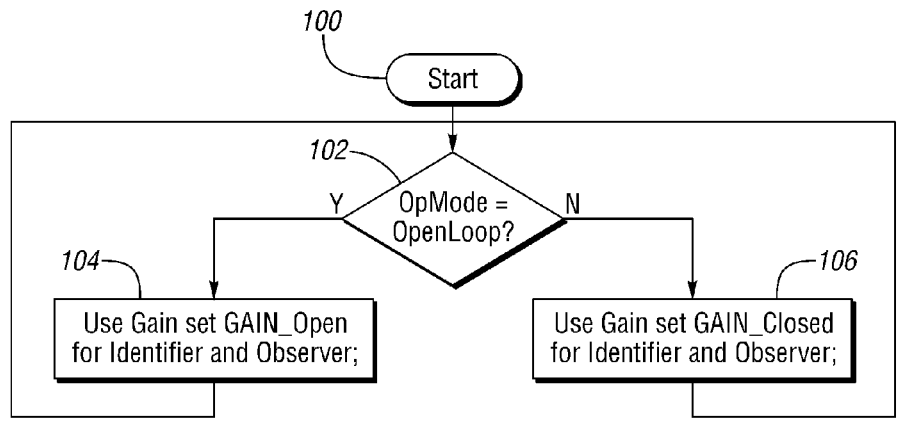
FIG. 5 is a block diagram illustrating gain scheduling based on operating modes in an embodiment of the invention.

FIG. 2 illustrates a battery equivalent circuit model in an embodiment of the invention. The circuit model is generally indicated at 20. Embodiments of the invention are not limited to any particular circuit models.

The state space equation for the battery equivalent circuit model in the illustrated embodiment may be developed as follows. The derivatives of $V_{OC}$ with respect to time can be related to that of the SOC vs. time as shown below:

$$\frac{dV_{oc}}{dt} = \frac{dV_{oc}}{dSOC} * \frac{dSOC}{dt} \tag{4}$$

Let $$\alpha = \frac{1}{C_c}$$

$$\beta = -\frac{1}{C_c * R_c} \tag{5}$$

$$\gamma = -R$$

According to the battery equivalent circuit model in FIG. 2:

$$V_{oc}(t) = R * I(t) + V_c(t) + V(t) \tag{6}$$

$$C_c * \frac{dV_c(t)}{dt} = I(t) - \frac{V_c(t)}{R_c}$$

Based on equation (3), with the assumed property that function f is first-order differentiable:

$$\frac{dV_{oc}}{dt} = \frac{dV_{oc}}{dSOC} * \frac{\eta I}{Q} \tag{7}$$

Combining equations (6) and (7):

$$\begin{bmatrix} \frac{dV_{oc}}{dt} \\ \frac{dV_c(t)}{dt} \end{bmatrix} = \begin{bmatrix} 0 & 0 \\ 0 & -\frac{1}{C_c * R_c} \end{bmatrix} * \begin{bmatrix} V_{oc} \\ V_c(t) \end{bmatrix} + \begin{bmatrix} \frac{dV_{oc}}{dSOC} * \eta \\ -\frac{Q}{C_c} \\ \frac{1}{C_c} \end{bmatrix} * I \tag{8}$$

$$V(t) = \begin{bmatrix} 1 & -1 \end{bmatrix} * \begin{bmatrix} V_{oc}(t) \\ V_c(t) \end{bmatrix} + [-R] * I \tag{9}$$

Recalling equation (5):

$$\begin{bmatrix} \frac{dV_{oc}}{dt} \\ \frac{dV_c(t)}{dt} \end{bmatrix} = \begin{bmatrix} 0 & 0 \\ 0 & \beta \end{bmatrix} * \begin{bmatrix} V_{oc} \\ V_c(t) \end{bmatrix} + \begin{bmatrix} -\frac{dV_{oc}}{dSOC} * \eta \\ \frac{Q}{\alpha} \end{bmatrix} * I \tag{10}$$

$$V(t) = \begin{bmatrix} 1 & -1 \end{bmatrix} * \begin{bmatrix} V_{oc}(t) \\ V_c(t) \end{bmatrix} + \gamma * I \tag{11}$$

Based on equation (6), an objective is to identify the model parameters, and estimate the state of charge (via open circuit voltage) at the same time:

In an embodiment of the invention, as observer can be designed based on equations (10) and (11):

$$\begin{bmatrix} \frac{d\hat{V}_{oc}}{dt} \\ \frac{d\hat{V}_c(t)}{dt} \end{bmatrix} = \begin{bmatrix} 0 & 0 \\ 0 & -\frac{1}{C_c * R_c} \end{bmatrix} * \begin{bmatrix} \hat{V}_{oc} \\ \hat{V}_c(t) \end{bmatrix} + \begin{bmatrix} -\frac{dV_{oc}}{dSOC} \hat{V}_{oc}^{\eta} \\ \frac{Q}{C_c} \\ \frac{1}{C_c} \end{bmatrix} * I + \tag{12}$$

$$L * (V(t) - \hat{V}(t))$$

$$\hat{V}(t) = \begin{bmatrix} 1 & -1 \end{bmatrix} * \begin{bmatrix} \hat{V}_{oc}(t) \\ \hat{V}_c(t) \end{bmatrix} + [-R] * I \tag{13}$$

In the illustrated embodiment, the observer described above is utilized to solve an indirect adaptive observation problem. It is appreciated that details of the observer may vary depending on the application. In the described embodiment, there are a number of features that may be implemented individually or in appropriate combinations depending on the application. Example technical features include open loop and closed loop operation, gain scheduling, modular architecture.

In the illustrated embodiment, the following approach is used for parameter identification. From equations (6) and (7):

$$\frac{dV_{oc}}{dt} = -\frac{dV_{oc}}{dSOC} * \frac{\eta I}{Q} \tag{14}$$

$$C_c * \frac{dV_c(t)}{dt} = I(t) - \frac{V_c(t)}{R_c}$$

$$V(t) = V_{oc}(t) - V_c(t) - R_r * I(t)$$

By obtaining a relationship between the parameters and system variables and then discretize the relationship:

$$[V(t) - V_{oc}(t)] = \left[\frac{dV_{oc}(t)}{dt} - \frac{dV(t)}{dt} I(t) \frac{dI(t)}{dt}\right] * \begin{bmatrix} R_c * C_c \\ R + R_c \\ R * R_c * C_c \end{bmatrix} \quad (15)$$

The discretized form:

$$\left[\frac{T_s}{2} * (V_{oc}(k+1) - V(k+1) + V_{oc}(k) - V(k))\right] = \quad (16)$$

$$\left[((V(k+1) - V(k)) - (V_{oc}(k+1) - V_{oc}(k))\frac{T_s}{2} * \right.$$

$$\left. (i(k+1) + i(k))i(k+1) - i(k)\right] * \begin{bmatrix} R_c * C_c \\ R + R_c \\ R * R_c * C_c \end{bmatrix}$$

One method that is widely used is the Kalman filter approach to slow-varying parameter identification. It is part of the family of recursive parameter estimation methods.

First, equation (16) is re-written as:

$$Y(k) = \Phi^T(k) * \Theta(k) \quad (17)$$

Then the Kalman filter-based recursive parameter estimation scheme can be expressed as:

$$\hat{\Theta}(k+1) = \hat{\Theta}(k) + K(k) * \left(Y(k+1) - \Phi^T(k) * \hat{\Theta}(k)\right) \quad (18)$$

$$K(k+1) = Q(k+1) * \Phi(k+1)$$

$$Q(k+1) = \frac{P(k)}{R_2 + \Phi(k+1)^T * P(k) * \Phi(k+1)}$$

$$P(k+1) = P(k) + R_1 - \frac{P(k) * \Phi(k) * \Phi(k)^T * P(K)}{R_2 + \Phi(k+1)^T * P(k) * \Phi(k+1)}$$

Where $\hat{\Theta}(k+1)$ is the estimated parameter vector, K, Q, P are related intermediate variable (matrices), and $R_1$ and $R_2$ are constants (calibratable variables).

It is appreciated that the Kalman filter approach to parameter identification is one possible approach that may be used. In the alternative, any recursive estimation scheme may be used, with varying robustness and accuracy, as appreciated by one of ordinary skill in the art.

Turning now to the SOC estimation, once a recursive estimation algorithm is chosen and the circuit parameters are well-learned, a nonlinear observer estimates the states ($V_{OC}$, $V_C$).

In the illustrated embodiment, assuming the related parameters have been identified from equation (16), the observer may be realized using the identified parameters:

$$\begin{bmatrix} \frac{d\hat{V}_{oc}}{dt} \\ \frac{d\hat{V}_c(t)}{dt} \end{bmatrix} = \begin{bmatrix} 0 & 0 \\ 0 & -\frac{1}{\hat{C}_c * \hat{R}_c} \end{bmatrix} * \begin{bmatrix} \hat{V}_{oc} \\ \hat{V}_c(t) \end{bmatrix} + \begin{bmatrix} -\frac{dV_{oc}}{dSOC} \hat{V}_{oc}^\eta \\ \frac{1}{\hat{C}_c} \end{bmatrix} * I + \quad (19)$$

$$L * (V(t) - \hat{V}(t))$$

$$\hat{V}(t) = [1 \quad -1] * \begin{bmatrix} \hat{V}_{oc}(t) \\ \hat{V}_c(t) \end{bmatrix} + [-\hat{R}] * I \quad (20)$$

Let $$e(t) \begin{bmatrix} V_{oc}(t) \\ V_c(t) \end{bmatrix} - \begin{bmatrix} \hat{V}_{oc}(t) \\ \hat{V}_c(t) \end{bmatrix} \quad (21)$$

$$\frac{de(t)}{dt} = \left(\begin{bmatrix} 0 & 0 \\ 0 & -\frac{1}{\hat{C}_c * \hat{R}_c} \end{bmatrix} - L * [1 \quad -1]\right) * e(t) + \quad (22)$$

$$\left(\begin{bmatrix} -\frac{dV_{oc}}{dSOC} V_{oc}^\eta \\ \frac{1}{\hat{C}_c} \end{bmatrix} - \begin{bmatrix} -\frac{dV_{oc}}{dSOC} \hat{V}_{oc}^\eta \\ \frac{1}{\hat{C}_c} \end{bmatrix}\right) * I$$

$$= \begin{bmatrix} -L_1 & L_1 \\ -L2 & L_2 - \frac{1}{\hat{C}_c * \hat{R}_c} \end{bmatrix} * e(t) +$$

$$\begin{bmatrix} -\frac{\left(\frac{dV_{oc}}{dSOC} V_{oc} - \frac{dV_{oc}}{dSOC} \hat{V}_{oc}\right) * \eta}{Q} \\ 0 \end{bmatrix} * I$$

Assuming exact estimation of circuit parameters, the observer shown above is stable in that by properly selecting gain L, the observer system can be made stable, as understood by one of ordinary skill in the art. Finally, for this observer, a fixed gain (L matrix) would work for the entire family of Li-Ion batteries represented by equations (10) and (11). More specifically, the observer gain L can be selected such as $L_1 > 0$, $L_2 = 0$ so the error dynamics is always stable for the entire family of the battery under any operating conditions.

In one aspect of the invention, the nonlinear term of $dV_{oc}/dSOC$ is expressed as a piece-wise linear function:

$$f_1(OCV(k)) = \begin{cases} l_1, & \text{if} \quad OCV(k) \in [OCV_0, OCV_1] \\ l_2, & \text{if} \quad OCV(k) \in [OCV_1, OCV_2] \\ \ldots & \ldots \\ l_{M-1}, & \text{if} \quad OCV(k) \in [OCV_{M-2}, OCV_{M-1}] \\ l_M, & \text{if} \quad OCV(k) \in [OCV_{M-1}, OCV_M] \end{cases} \quad (23)$$

It is appreciated that the nonlinear term $dV_{oc}/dSOC$ is determined by a nonlinear mapping from $V_{oc}$. The piece-wise linear map is one possibility; other mappings are possible.

It is appreciated that the described observer is only an example, and other observers may be used in other embodiments of the invention.

In order to use equation (16), $V_{OC}$ must be known, which is not available directly when a closed loop identification scheme is used. Rather, $V_{OC}$ has to be obtained through the observer. However, the observer depends on estimated parameters. To address this situation, the considered battery in the example embodiment, when key-on after the battery has rested for a sufficiently long time, the measurement of terminal voltage can be considered as the open circuit voltage. In turn, this gives an initial reading of SOC. Further, amp-hour integration works adequately when the time horizon is relatively short. During open loop operation, the parameters and estimated state variables should converge to a small neighborhood of the true values, respectively.

Figure 3:
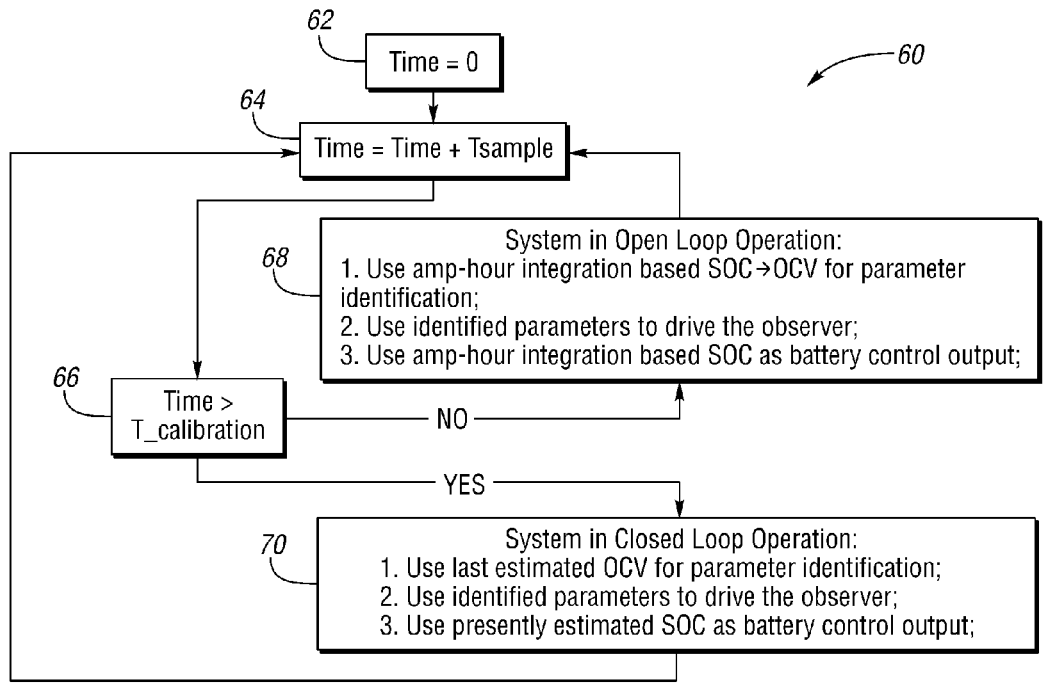
FIG. 3 is a block diagram illustrating determination of open-loop versus closed-loop operations in an embodiment of the invention.

In accordance with an aspect of the invention, combined open loop/closed loop operation is performed. FIG. 3 illustrates determination of open-loop versus closed-loop operations, at 60.

In the illustrated embodiment, flow begins at block 62 (Time=0). Time is incremented by Tsample at each sampling interval, at block 64. In this embodiment, at decision block 66, the system operates in open loop mode for an initial amount of time, T_calibration. Thereafter, the system operates in closed loop mode. Open loop mode system operation is indicated at block 68. Closed loop mode system operation is indicated at block 70.

In the open loop mode, at block 68, amp-hour integration based SOC is used to determine open circuit voltage (OCV) $V_{OC}$ for parameter identification; the identified parameters are used to drive the observer; and amp-hour integration based SOC is used as the battery control output for the system. The output SOC is used by a vehicle system controller to control the vehicle, as appreciated by one of ordinary skill in the art. Embodiments of the invention are not limited to any particular SOC based control of the vehicle; rather, embodiments of the invention relate to methods of estimating SOC for use by such controls.

In the closed loop mode, at block 70, the last estimated $V_{OC}$ is used for parameter identification; the identified parameters are used to drive the observer; the presently estimated SOC is used as the battery control output.

It is appreciated that determination of the length of open loop operation may occur in other ways. For example, determination of length of open loop operation can either be a timer-based, or via input current assessment as to how rich the input has been and for how long. For example, the system may monitor |dI/dt|, and prevent the switch to closed loop control until |dI/dt|>threshold for a certain predetermined amount of time T_threshold.

Figure 4:
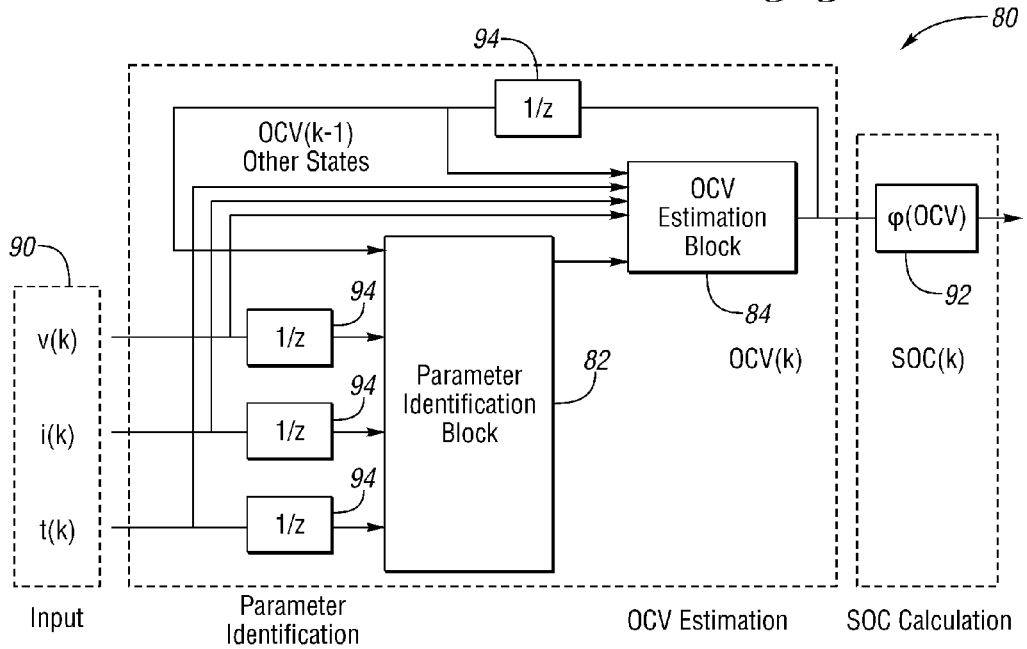
FIG. 4 illustrates a generic observer architecture in an embodiment of the invention.

FIG. 4 illustrates a generic observer architecture, including parameter identification block 82, OCV estimation block 84, inputs 90, SOC calculation block 92, and various delay blocks 94.

During closed loop operation, OCV estimation block 84 estimates OCV ($V_{OC}$, circuit 20, FIG. 2). The battery state of charge (SOC) is determined at SOC calculation block 92 from the nonlinear mapping of $V_{OC}$ to SOC (FIG. 1). The observer in OCV estimation block 84 is driven with parameters identified by parameter identification block 82. The last estimated OCV value is used for parameter identification. Parameter identification block 82, in addition to receiving the last estimated OCV value, receives inputs 90, depicted as voltage, current, and temperature.

Figure 6:
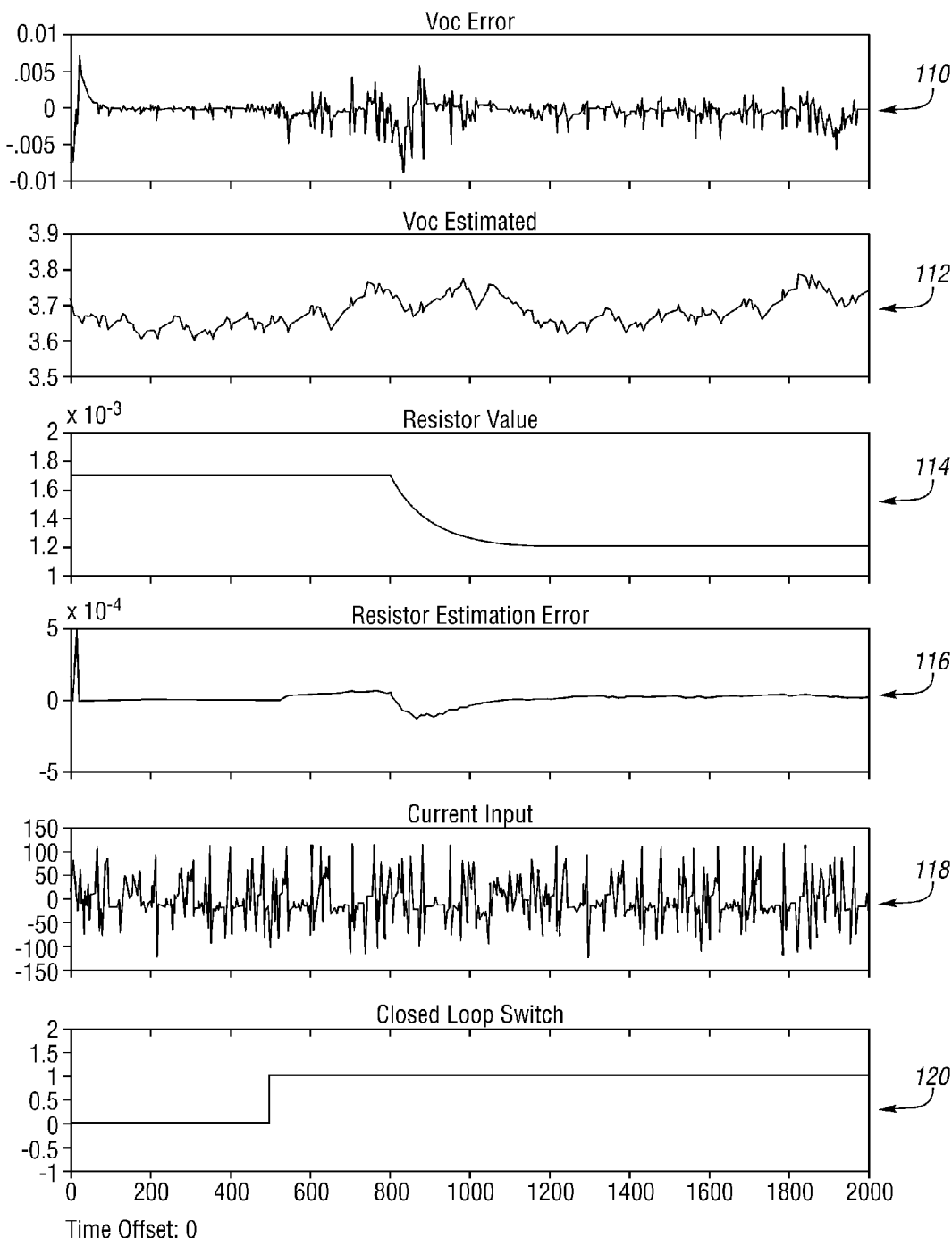
FIG. 6 illustrates a simulation of an embodiment of the invention.

In order to further improve the robustness and stability of the closed loop system, identifier gain and observer gain can both be adjusted so the overall closed loop system gain is reduced compared with the counterpart in open loop. This is shown in FIG. 6. Flow begins at block 100. The operating mode is determined at decision block 102. Open loop mode operation is indicated at block 104. Closed loop operation is indicated at block 106. At block 104, in open loop operation, more aggressive gain values are used for the identifier and observer. At block 106, in closed loop operation, less aggressive gain values are used for the identifier and observer.

In summary, the overall described approach involves several steps in the illustrated embodiment. When key-on, SOC-OCV look-up table should provide sufficiently accurate SOC estimation after sufficiently long rest of the battery. The amp-hour integration based SOC estimation (and SOC-OCV mapping) can be used for parameter identification (open loop mode). At the same time, the state observer (estimator) is performing OCV estimation using identified parameters. As time goes by, the amp-hour integration tends to diverge from real SOC value (hence OCV value). Eventually, the system switches to closed loop mode. Once in closed loop mode, the identified parameters are fed to the OCV estimator. In turn, the OCV estimator produces an OCV value, which is fed (after one-step delay) to the parameter identifier. The estimated OCV is translated to SOC based on a known SOC-OCV curve. When operating in the open loop, the amp-hour integrated SOC is used as the battery control output.

Embodiments of the invention have many advantages. For example, a combined open loop/closed loop scheme, with parameter estimation and OCV estimation subsystems, better utilizes intrinsic properties of considered batteries. The modular nature of the architecture allows the use of different identifiers and observers. For example, different identifiers/observers may be used depending on the operating modes. The described embodiment also contemplates a gain scheduling approach used to achieve both fast learning in open loop, and stable adaptation in closed loop.

FIG. 6 illustrates a simulation of an embodiment of the invention. Von error is indicated at 110. $V_{OC}$ estimated value is indicated at 112. Resistor value is indicated at 114. Resistor estimation error is indicated at 116. Current input is indicated at 118. Closed loop switch, indicated at 120, changes from 0 to 1 when the system switches from open loop operation mode to closed loop operation mode.

Embodiments of the invention are not limited to those described herein. Various other embodiments are possible within the scope of the invention. For example, embodiments of the invention may be extended to any higher order equivalent circuit model where a voltage source (OCV), a resistor, and a number of series RC networks connected in series is used to model the battery.

Figure 7:
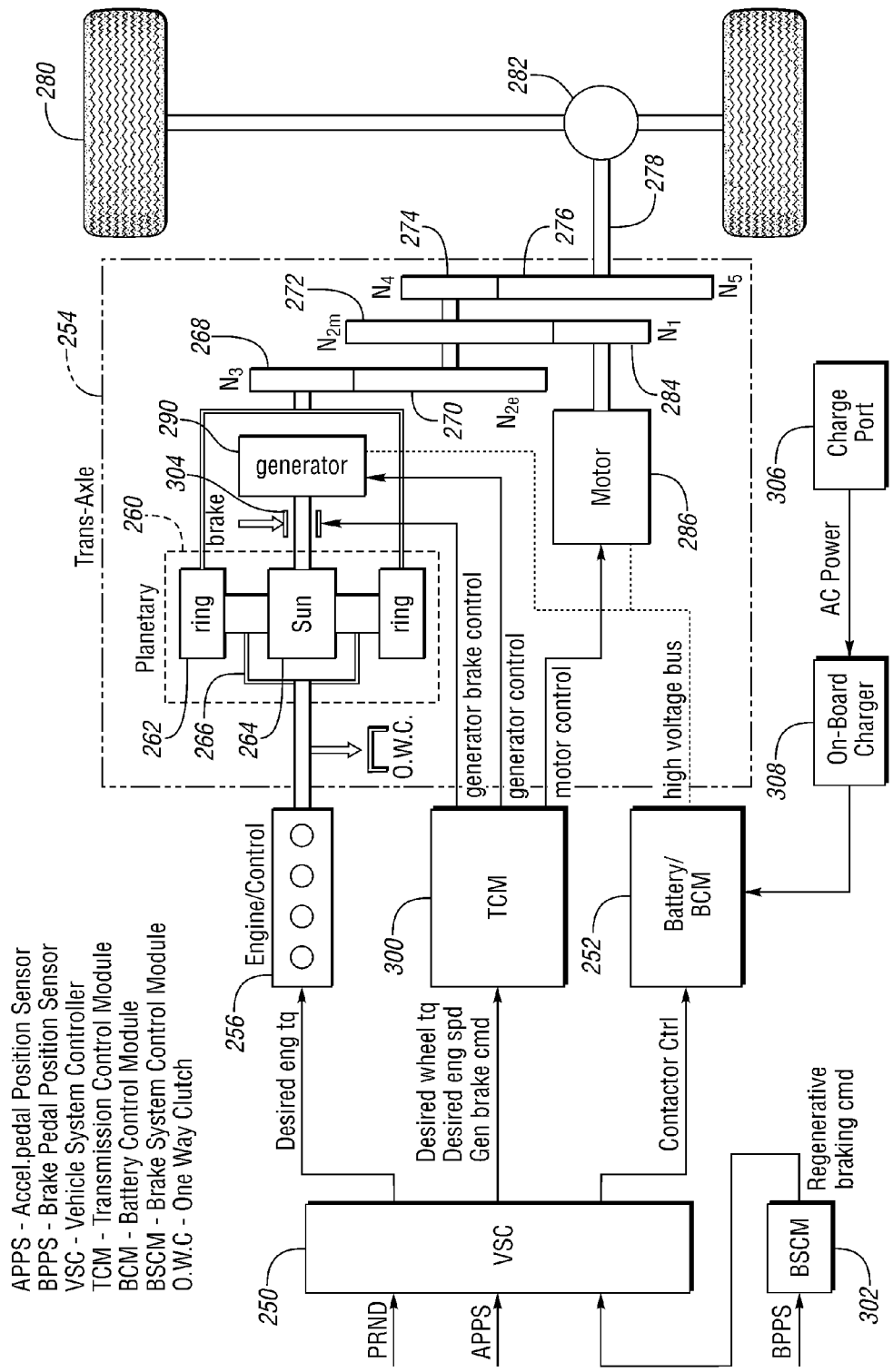
FIG. 7 is a schematic representation of a hybrid electric vehicle powertrain capable of embodying the invention.

FIG. 7 is a schematic representation of a hybrid electric vehicle powertrain capable of embodying the invention. The power split hybrid electric vehicle (HEV) is a parallel hybrid electric vehicle. FIG. 7 shows the power split HEV powertrain configuration and control system. In this powertrain configuration, there are two power sources that are connected to the driveline: 1) a combination of engine and generator subsystems using a planetary gear set to connect to each other, and 2) the electric drive system (motor, generator, and battery subsystems). The battery subsystem is an energy storage system for the generator and the motor.

In the first power source, the engine output power can be split into two paths by controlling a generator-mechanical path $t_r\omega_r$ (from the engine to the carrier to the ring gear to counter shaft), and an electrical path $\tau_g\omega_g$ to $\tau_m\omega_m$ (from the engine to the generator to the motor to the counter shaft). The way to split the engine power is to control the engine speed to a desired value, which results in a definite generator speed for a given ring gear speed, (or vehicle speed), because of the kinematic property of a planetary gear set.

The generator speed will change according to the vehicle speed for a definite desired engine speed, and the engine speed can be decoupled from the vehicle speed. The changing generator speed will vary the engine output power split between an electrical path and a mechanical path. In addition, the control of engine speed results in a generator torque to react against the engine output torque. It is this generator reaction torque that conveys the engine output torque to the ring gear of the planetary gear set, and eventually to the wheels. This mode of operation is called "positive split". It is noted that because of the mentioned kinematic property of the planetary gear set, the generator can possibly rotate in the same direction of its torque that reacts against the engine output torque. In this operation, the generator inputs power (like the engine) to the planetary gear set to drive the vehicle. This operation mode is called "negative split".

As in the case of the positive split mode, the generator torque resulting from the generator speed control during a negative split reacts to the engine output torque and conveys the engine output torque to the wheels. This combination of the generator, the motor and the planetary gear set is analogous to an electro-mechanical CVT. When the generator brake (shown in FIG. 7) is actuated (parallel mode operation), the sun gear is locked from rotating and the generator braking torque provides the reaction torque to the engine output torque. In this mode of operation, all the engine output power is transmitted, with a fixed gear ratio, to the drivetrain through the mechanical path.

In a power split powertrain system, unlike conventional vehicles, the engine requires either the generator torque resulting from engine speed control or the generator brake torque to transmit its output power through both the electrical and mechanical paths (split modes) or through the all-mechanical path (parallel mode) to the drivetrain for forward motion.

In the second power source, the electric motor draws power from the battery and provides propulsion independently from the engine to the vehicle for forward and reverse motions. This operating mode is called "electric drive". In addition, the generator can draw power from the battery and drive against a one-way clutch coupling on the engine output shaft to propel the vehicle forward. The generator can propel the vehicle forward alone when necessary. This mode of operation is called generator drive mode.

The operation of this power split powertrain system, unlike conventional powertrain systems integrates the two power sources to work together seamlessly to meet the driver's demand without exceeding the system's limits (such as battery limits) while optimizing the total powertrain system efficiency and performance. Coordination control between the two power sources is needed. As shown in FIG. 1, there is a hierarchical vehicle system controller (VSC) that performs the coordination control in this power split powertrain system. Under normal powertrain conditions (no subsystems/components faulted), the VSC interprets the driver's demands (e.g. PRND and acceleration or deceleration demand), and then determines the wheel torque command based on the driver demand and powertrain limits. In addition, the VSC determines when and how much torque each power source needs to provide in order to meet the driver's torque demand and achieve the operating point (torque and speed) of the engine.

With continuing reference to FIG. 7, a vehicle system controller (VSC) 250, a battery and battery energy control module (BCM) 252, and a transmission 254 are shown. An internal combustion engine 256 distributes torque to transmission 254. The transmission 254 includes a planetary gear unit 260, which comprises a ring gear 262, a sun gear 264, and a planetary carrier assembly 266. The ring gear 262 distributes torque to step ratio gears comprising meshing gear elements 268, 270, 272, 274, and 276. A torque output shaft 278 for the transmission 254 is drivably connected to vehicle traction wheels 280 through a differential and axle mechanism 282.

Gears 270, 272, and 274 are mounted on a countershaft, with gear 272 engaging a motor-driven gear 284. Electric motor 286 drives gear 284, which acts as a torque input for the countershaft gearing.

The battery delivers electric power to the motor. Generator 290 is connected electrically to the battery and to the motor 286 in a known fashion.

Also shown in FIG. 1 are a transmission control module (TCM) 300 and a brake system control module (BSCM) 302. TCM 300 provides generator brake control to generator brake 304, provides generator control to generator 290, and provides motor control to motor 286. BSCM 302 provides a regenerative braking command to VSC 250. VSC 250 also receives acceleration pedal position sensor (APPS) input, and park-reverse-neutral-drive (PRND) input. VSC 250 provides outputs for; desired engine torque to engine/control 256; desired wheel torque, desired engine speed, and generator brake command to TCM 300; and contactor control to battery/BCM 252.

Fueling is scheduled based on driver and other inputs. Engine 256 delivers power to the planetary gear unit 260. The available engine brake power is reduced by accessory loads. Power is delivered by the planetary ring gear to the countershaft gears 270, 272, 274. Power output from the transmission drives the wheels.

Also shown in FIG. 1, battery 252 periodically receives AC electrical energy from the grid via a charge port 306 connected to the grid. An on-board charger 308 receives the AC electrical energy from charge port 306. Charger 308 is an AC/DC converter which converts the received AC electrical energy into DC electrical energy suitable for charging battery 252. In turn, charger 308 supplies the DC electrical energy to battery 252 in order to charge battery 252 during the recharging operation.

Embodiments of the invention are not limited to those described herein. Various other embodiments are possible within the scope of the invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for estimating battery state of charge of an electric vehicle including an internal combustion engine, a battery having a state of charge (SOC) and an open circuit voltage (OCV), the method comprising:
    establishing a system operable in open and closed loop modes for estimating battery SOC based on a current-time integration in the open loop mode, including (i) a parameter estimation subsystem including a recursive parameter estimator for estimating battery parameters based on a previous estimate of battery OCV in the closed loop mode and (ii) an OCV estimation subsystem including a nonlinear adaptive observer for estimating battery OCV based on the battery parameters and a previous estimate of battery OCV, wherein estimated battery OCV is related to estimated battery SOC by a mapping and wherein the system operates in the open loop mode at startup and switches to the closed loop mode based on a predetermined condition; and
    generate an output based on the estimated battery SOC.

2. The method of claim 1 wherein in the closed loop mode the system estimates battery SOC based on a current estimate of battery OCV and the mapping.

3. The method of claim 1 wherein in the open loop mode the recursive parameter estimator estimates battery parameters based in part on the estimated battery SOC and the mapping.

4. The method of claim 1 wherein the predetermined condition is based on a timer.

5. The method of claim 1 wherein the recursive parameter estimator has a first gain in the open loop mode and a second gain that is less than the first gain in the closed loop mode.

6. The method of claim 1 wherein the adaptive observer has a first gain in the open loop mode and a second gain that is less than the first gain in the closed loop mode.

7. The method of claim 6 wherein in the closed loop mode the system estimates battery SOC based on a current estimate of battery OCV and the mapping.

8. The method of claim 6 wherein in the open loop mode the recursive parameter estimator estimates battery parameters based in part on the estimated battery SOC and the mapping.

9. A vehicle comprising:
   a battery having a state of charge (SOC) and an open circuit voltage (OCV); and
   a controller programmed to
      establish a system operable in open and closed loop modes for estimating battery SOC based on a current-time integration in the open loop mode, including (i) a parameter estimation subsystem including a recursive parameter estimator for estimating battery parameters based on a previous estimate of battery OCV in the closed loop mode and (ii) an OCV estimation subsystem including a nonlinear adaptive observer for estimating battery OCV based on the battery parameters and a previous estimate of battery OCV, wherein estimated battery OCV is related to estimated battery SOC by a mapping and wherein the system operates in the open loop mode at startup and switches to the closed loop mode based on a predetermined condition, and
      generate an output based on the estimated battery SOC.

10. The vehicle of claim 9 wherein in the closed loop mode the system estimates battery SOC based on a current estimate of battery OCV and the mapping.

11. The vehicle of claim 9 wherein in the open loop mode the recursive parameter estimator estimates battery parameters based in part on the estimated battery SOC and the mapping.

12. The vehicle of claim 9 wherein the predetermined condition is based on a timer.

13. The vehicle of claim 9 wherein the recursive parameter estimator has a first gain in the open loop mode and a second gain that is less than the first gain in the closed loop mode.

14. The vehicle of claim 9 wherein the adaptive observer has a first gain in the open loop mode and a second gain that is less than the first gain in the closed loop mode.

15. The vehicle of claim 14 wherein in the closed loop mode the system estimates battery SOC based on a current estimate of battery OCV and the mapping.

16. The vehicle of claim 14 wherein in the open loop mode the recursive parameter estimator estimates battery parameters based in part on the estimated battery SOC and the mapping.

* * * * *